United States Patent
Sivaramakrishnan Radhakrishnan et al.

(10) Patent No.: US 10,847,662 B2
(45) Date of Patent: Nov. 24, 2020

(54) METHOD OF CLEANING AN EXPOSED SURFACE OF A BACK CONTACTED SOLAR CELL BY DEPOSITING AND REMOVING A SACRIFICIAL LAYER

(71) Applicant: IMEC VZW, Leuven (BE)

(72) Inventors: Hariharsudan Sivaramakrishnan Radhakrishnan, Leuven (BE); Jef Poortmans, Kessel-Lo (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/426,796

(22) Filed: May 30, 2019

(65) Prior Publication Data
US 2019/0371946 A1   Dec. 5, 2019

(30) Foreign Application Priority Data

May 30, 2018 (EP) .................... 18175113

(51) Int. Cl.
| | |
|---|---|
| *H01L 31/0224* | (2006.01) |
| *H01L 31/18* | (2006.01) |
| *H01L 31/0747* | (2012.01) |
| *H01L 31/20* | (2006.01) |
| *H01L 31/072* | (2012.01) |
| *H01L 31/0216* | (2014.01) |

(52) U.S. Cl.
CPC .. *H01L 31/022441* (2013.01); *H01L 31/0747* (2013.01); *H01L 31/1804* (2013.01);
(Continued)

(58) Field of Classification Search
CPC ......... H01L 31/022441; H01L 31/0747; H01L 31/0682; H01L 31/1804; H01L 31/1868; H01L 31/202
See application file for complete search history.

(56) References Cited

U.S. PATENT DOCUMENTS

| | | |
|---|---|---|
| 6,277,194 B1 | 8/2001 | Thilderkvist et al. |
| 70,646,073 | 6/2006 | U'Ren |

(Continued)

FOREIGN PATENT DOCUMENTS

EP   3319132 A1   5/2018

OTHER PUBLICATIONS

Tucci M. et al., "Back Contacted a-Si:H/c-Si Heterostructure Solar Cells", Journal of Non-Crystalline Solids, vol. 354, No. 19-25, pp. 2386-2391. (Year: 2008).*

(Continued)

*Primary Examiner* — Ermias T Woldegeorgis
(74) *Attorney, Agent, or Firm* — McDonnell Boehnen Hulbert & Berghoff LLP

(57) ABSTRACT

A method is provided for creating an interdigitated pattern for a back-contacted solar cell, including deposition of a first passivation layer stack including a-Si of a first doping type, patterning the first passivation layer stack by using a first dry etching process to create one or more regions including the a-Si of the first doping type and one or more exposed regions of the surface, cleaning the one or more exposed regions of the surface from contaminants remaining from the first dry etching process, and depositing a second passivation layer stack including a-Si of a second doping type different from the first doping type to create the interdigitated pattern together with the patterned first passivation layer stack. The cleaning may include depositing a sacrificial layer at least on the exposed regions of the surface, and removing the sacrificial layer by a second dry etching process, at a temperature not exceeding 250° C.

15 Claims, 3 Drawing Sheets

(52) U.S. Cl.
CPC ........ *H01L 31/1868* (2013.01); *H01L 31/202* (2013.01); *H01L 31/02167* (2013.01); *H01L 31/072* (2013.01)

(56) References Cited

U.S. PATENT DOCUMENTS

| | | |
|---|---|---|
| 2003/0000547 A1 | 1/2003 | Carpenter et al. |
| 2003/0170992 A1 | 9/2003 | Farber et al. |
| 2006/0194442 A1 | 8/2006 | Baltzinger et al. |
| 2018/0122963 A1* | 5/2018 | Xu .................... H01L 31/0747 |

OTHER PUBLICATIONS

European Search Report, European Patent Application No. 181751132.2, dated Nov. 9, 2018, 8 pages.

Xu, Menglei et al., "Damage-Free Laser Ablation for Emitter Patterning of Silicon Heterojunction Interdigitated Back-Contact Solar Cells", Proc. 44th IEEE Photovoltaic Specialist Conf.(PVSC). Jun. 2017, 5 pages.

Tucci, M. et al., "Back Contacted a-Si:H/c-Si Heterostructure Solar Cells", Journal of Non-Crystalline Solids, vol. 354, No. 19-25, 2008, pp. 2386-2391.

Lin, Peng et al., "Mold Cleaning With Polydimethylsiloxane (PDMS) for Nanoimprint Lithography", University of Massachusetts—Amherst, From the SelectedWorks of Qiangfei Xia, available at: http://works.bepress.com/qiangfei_xia/11/, 2013, 11 pages.

Granata, Stefano Nicola et al., "Improved Surface Cleaning by In-Situ Hydrogen Plasma for Amorphous/Crystalline Silicon Heterojunction Solar Cells", Solid State Phenomena, vol. 195, 2013, pp. 321-323.

* cited by examiner

METHOD OF CLEANING AN EXPOSED SURFACE OF A BACK CONTACTED SOLAR CELL BY DEPOSITING AND REMOVING A SACRIFICIAL LAYER

CROSS-REFERENCE TO RELATED APPLICATIONS

The present application is a non-provisional patent application claiming priority to European Application No. 18175113.2, filed May 30, 2018, the contents of which are hereby incorporated by reference.

FIELD OF THE DISCLOSURE

The present disclosure relates to the field of production of solar cells. In particular, the present disclosure relates to a method for creating an interdigitated pattern for a back-contacted solar cell.

BACKGROUND

Silicon solar cells of e.g. the heterojunction interdigitated back-contacted (HJ-IBC) type may provide a high energy conversion efficiency. To extract the charge carriers in e.g. back-contacted cells, the rear side of such cells is patterned into interdigitated strips or patterns of electron and hole contacts.

However, such rear-side patterning may be both complex and expensive, and involve a plurality of processing steps such as surface passivation, material deposition, etching, lithography, laser ablation and/or repassivation.

To achieve e.g. widespread commercial application of for example HJ-IBC technology, there is therefore a need for an improved and simplified patterning process for solar cells.

SUMMARY

To at least partly satisfy the above need, the present disclosure provides a method for creating an interdigitated pattern for a solar cell as defined in the independent claim. Further embodiments of the method are defined in the dependent claims.

According to an aspect of the present disclosure, a method for creating an interdigitated pattern for a back-contacted solar cell is provided. The method may include depositing a first passivation layer stack including at least a layer of amorphous silicon (a-Si) of a first doping type on a surface of a silicon substrate (or wafer) of the solar cell. The method may include patterning the first passivation layer stack by using a first dry etching process, thereby creating one or more regions including the a-Si of the first doping type, and one or more exposed regions of the surface (of the silicon substrate). The method may include cleaning the one or more exposed regions of the surface from contaminants remaining from the first dry etching process. The method may include depositing, after the cleaning, a second passivation layer stack including at least a layer of a-Si of a second doping type different from the first doping type on the one or more exposed regions, thereby creating one or more regions including the a-Si of the second doping type on the one or more exposed regions of the surface. The patterned first passivation layer stack and the one or more regions including the a-Si of the second doping type (on the exposed regions of the surface) may form the interdigitated pattern. The cleaning may include depositing a sacrificial layer at least on the one or more exposed regions of the surface. The cleaning may further include removing the sacrificial layer by a second dry etching process. The depositing and removing of the sacrificial layer may be performed at a temperature not exceeding 250° C.

The deposited sacrificial layer may take up the contaminants which may remain from the first dry etching process and patterning of the first passivation layer stack. The contaminants may then be removed together with the sacrificial layer using the second dry etching process. The second dry etching process may involve the use of non-contaminating etch species (e.g. species which are not detrimental to surface passivation). The method according to the present disclosure thereby allows for cleaning of the exposed regions of the surface of the solar cell substrate/wafer, before repassivation, without using wet chemicals. Such wet chemicals, such as e.g. HF, may also be potentially dangerous, and the method according to the present disclosure may offer both a more simplified and more safe method of rear-side patterning for the solar cell. In addition, the method according to the present disclosure may provide a cleaning at low temperature (such as at or below 250° C.).

Herein, a passivation layer stack may include more than one layer. For example, a passivation layer stack that includes a layer of a-Si of a certain doping type (such as p- or n-doping) may include also a layer of e.g. intrinsic a-Si. Such an intrinsic layer may for example help to improve the surface passivation. When depositing the first passivation layer stack, there may for example be an intrinsic a-Si layer closest to the surface of the substrate, followed by the a-Si layer of the first doping type. Likewise, when depositing the second passivation layer stack on the one or more exposed regions, there may be an intrinsic a-Si layer closest to the (exposed) surface of the substrate, followed by the a-Si layer of the second doping type. As used herein, depositing something "on" a surface may include depositing the something directly on the surface.

In some embodiments, the sacrificial layer may be a layer of a-Si.

In some embodiments, an average thickness of the sacrificial layer may be below 2 nm, may be below 1.5 nm, and may even be below 1 nm. A thinner sacrificial layer may e.g. be removed by the second dry etching process without excessive damage to the (crystalline) Si substrate/wafer of the solar cell. A thinner sacrificial layer may for example reduce the required etching time, thereby reducing the number of defects induced in the underlying Si substrate (or wafer). This may be important e.g. if parallel plate plasma-enhanced chemical vapor deposition (PECVD) tools are used for the etching, especially without remote plasmas.

In some embodiments, the first dry etching process may be an $NF_3/Ar$ plasma etching process. It is envisaged also to use (plasma) etching processes based on other chemistries also suitable for etching of passivation layer stacks, such as for example $CF_4/O_2$, $SF_6$, or others.

In some embodiments, the second dry etching process may be a hydrogen plasma etching process. Such a process may e.g. be performed without contaminating species, detrimental to surface passivation. It is envisaged also that other dry etching processes (involving e.g. other etch gases) may be used as the second dry etching process, provided they do not involve contaminants such as e.g. F, N, C, S and O which may remain on the substrate surface after etching.

In some embodiments, the sacrificial layer may be deposited using a PECVD process.

In some embodiments, the deposition and/or patterning (at least including the etching using the first dry etching process) of the first passivation layer stack and the cleaning of the one or more exposed regions may be performed within a same PECVD tool. Using a same tool may for example allow the cleaning to be performed without breaking a vacuum of the tool, e.g. by not having to remove the sample/substrate/solar cell from the tool in order to perform the cleaning. This is in contrast to a conventional process, wherein, as will be described later herein, e.g. a wet chemical HF clean is required for cleaning the exposed regions after patterning of the first passivation layer stack. As will also be described later herein, such a conventional process may require the removal of the substrate from the tool before cleaning, and the subsequent return of the substrate into the tool for e.g. a subsequent repassivation.

The use of a plasma based (PECVD) process (e.g. for deposition and/or cleaning) may allow for a lower temperature to be used, which may reduce potential harm done to e.g. the solar cell. Use of the PECVD process may allow the sequence from dry etching until repassivation to be performed in situ without a vacuum break, as described earlier herein and as will be described in more detail further below.

In some embodiments, the deposition of the second passivation layer stack may be performed within the same PECVD tool. Depositing the second passivation layer also within the same tool may provide a further simplified process with higher throughput.

In some embodiments, the first doping type may be positive (i.e. the first passivation layer stack may include a p-doped layer), and the second doping type may be negative (i.e. the second passivation layer stack may include an n-doped layer).

In some embodiments, the first doping type may be negative (i.e. the first passivation layer stack may include an n-doped layer), and the second doping type may be positive (i.e. the second passivation layer stack may include a p-doped layer).

In some embodiments, the method may further include forming electrodes contacting the one or more regions including the a-Si of the first doping type and the one or more regions including the a-Si of the second doping type.

In some embodiments, the deposition and removing of the sacrificial layer may be performed at a temperature not exceeding 200° C. A lower temperature (such as 200° C. or below) may further reduce potential damage to the solar cell.

In some embodiments, the depositing and removing of the sacrificial layer may be performed at a temperature of or above 150° C.

In some embodiments, the depositing and removing of the sacrificial layer may form part of a single plasma process. Using a single plasma process may e.g. further increase substrate/wafer throughput.

The present disclosure relates to all possible combinations of features mentioned herein, including the ones listed above as well as other features which will be described in what follows with reference to different embodiments. Any embodiment described herein may be combinable with other embodiments also described herein, and the present disclosure relates also to all such combinations.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figures 1, 2:
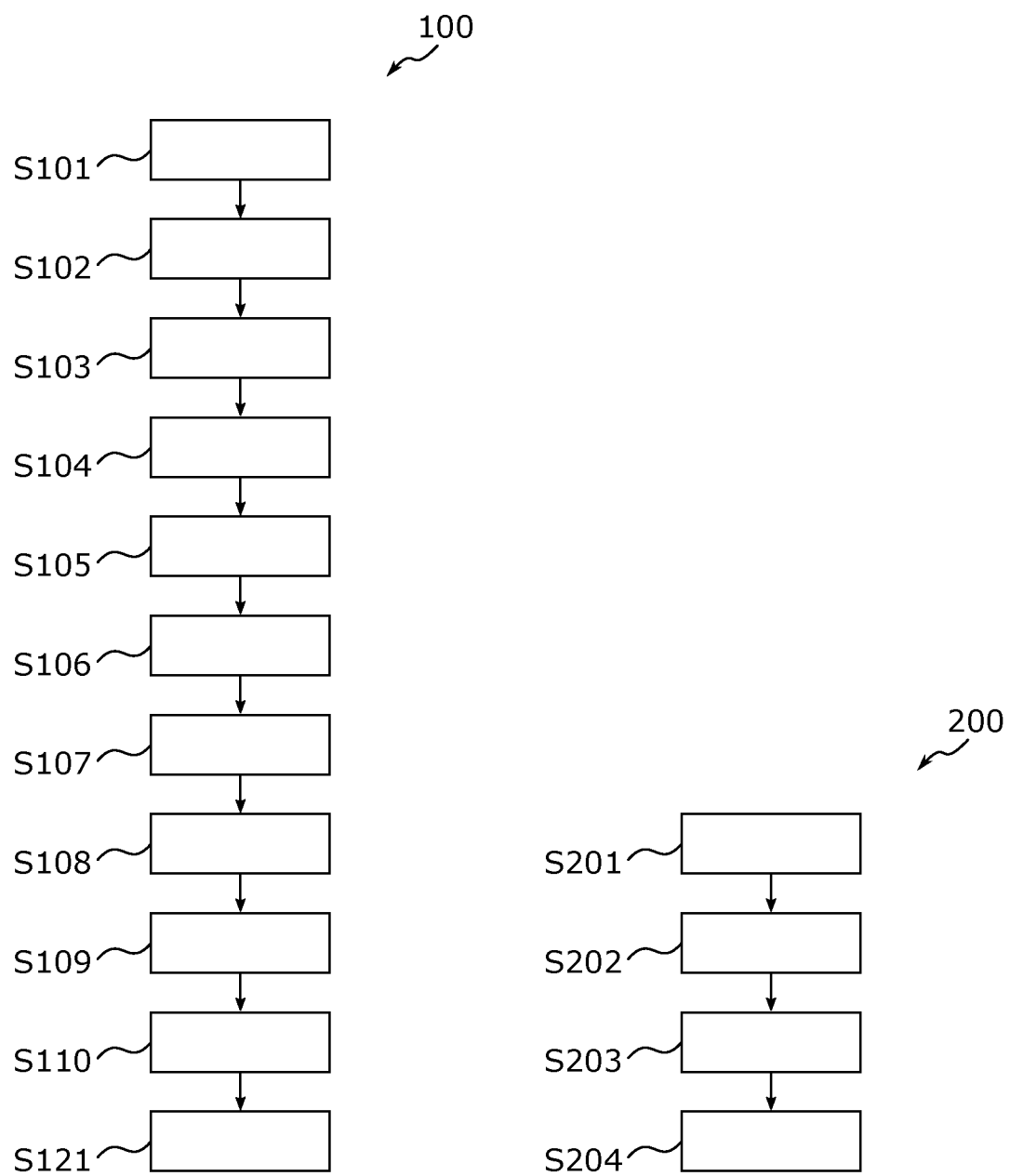
FIG. 1 schematically illustrates a flowchart of a conventional process/method for creating a solar cell.
FIG. 2 schematically illustrates a flowchart of an embodiment of a method for creating an interdigitated pattern of a back-contacted solar cell according to the present disclosure.

FIG. 1 illustrates schematically a flowchart for a conventional process (or method) 100 for fabrication of a back-contacted solar cell. The solar cell may be fabricated from e.g. silicon substrates. The silicon substrate(s) may for example have a negative doping (n-type), and the substrate(s) may have e.g. a resistivity of 2-5 Ω·cm, 100-200 µm thickness and be fabricated using e.g. a Czochralski, epitaxial growth or float zone process.

In a step S101, single-side or double-side texturing of the substrate may be performed in an alkaline solution (such as e.g. TMAH or KOH). A temperature of the alkaline solution may be e.g. between 60 to 80° C. If only one side of the substrate is textured (i.e. single-side texturing), the other (rear-side) of the substrate may be protected during texturing with e.g. a dielectric mask. After texturing, the substrate may be cleaned using wet chemicals.

In a step S102, after cleaning of the substrate, the rear surface of the substrate may be passivated by depositing a first passivation layer stack. The first passivation layer stack may include for example a layer of intrinsic hydrogenated amorphous silicon (a-Si:H(i)) and a layer of e.g. positively doped (p-doped) hydrogenated a-Si (a-Si:H(p$^+$)). The first passivation layer stack may form e.g. the emitter of the solar cell, and may be deposited at e.g. 175° C. using a plasma-enhanced chemical vapor deposition (PECVD) process. In some situations, a back surface field stack (e.g. a passivation layer stack wherein the doped layer has a negative, n-type, doping; a-Si:H(i/n$^+$)) may be deposited first.

After the first passivation layer stack has been laid down, in a step S103, a PECVD-based dielectric stack may be deposited at e.g. 225° C., as an etch hard mask and as a sacrificial layer for lift-off of a second passivation layer stack further in the process. This hard mask may include e.g. silicon oxide (SiO$_x$), silicon nitride (SiN$_x$) and/or layer(s) of a-Si:H.

In a step S104, the hard mask may be patterned using e.g. lithography (using e.g. a SiO$_x$ mask) or laser ablation (using e.g. an alternating stack of SiO$_x$ and SiN$_x$ with different refractive indices to form a distributed Bragg reflector with an a-Si:H layer on top which is patterned by the laser ablation). The dielectric hard mask may then be patterned using wet etching to expose the a-Si:H underneath the hard mask, after lithography or laser ablation.

The exposed areas of a-Si:H (first passivation layer stack) may then, in a step S105, be dry-etched using e.g. an $NF_3$/Ar plasma at a temperature of e.g. 175° C., to thereby pattern the first passivation layer stack (to form a patterned first passivation stack) and to thereby create one or more regions including the a-Si:H of the first doping type and one or more exposed regions of the substrate surface.

After dry-etching, the etched surfaces may contain traces of etch product which may be considered as surface contamination. In situ repassivation of the surface without removal of such residual contamination may result in poor repassivation. Thus, in a step S106, the etched surfaces are cleaned in order to enable a subsequent high quality repassivation. The cleaning is performed ex situ, typically using an HF cleaning process in which the dry-etch-related contaminants are removed.

After the ex situ cleaning, in a step S107, the cleaned substrate surface is then repassivated using e.g. a second passivation layer stack including hydrogenated layers of intrinsic and negatively doped (n-type) a-Si (i.e. a-Si:H $(i/n^+)$. The second passivation layer stack may form the back surface field, and may be deposited using a PECVD process at a temperature of e.g. 175° C.

In a step S108, dissolution of the hard mask and, as a result thereof, lift-off of a-Si:H $(i/n^+)$ in a-Si:H $(i/p^+)$ areas may then be performed in e.g. dilute HF solution, thereby creating a patterned second passivation layer stack consisting of one or more regions including a-Si:H of the second type on the exposed regions of the silicon surface. This may result in a structure wherein the one or more regions including the a-Si:H of the second type (the patterned second passivation layer stack) and the one or more regions including the a-Si:H of the first type (the patterned first passivation layer stack) form an interdigitated pattern on the surface of the silicon substrate.

In a step S109, the textured front surface may also be passivated with intrinsic a-Si:H and a PECVD $SiN_x$ anti-reflection coating (ARC) may be applied on top, both using processes at a temperature of e.g. 175° C.

In a step S110, a layer of e.g. indium tin oxide (ITO) may be deposited by using e.g. sputtering on the rear surface, and copper may be evaporated on the ITO layer using e.g. e-beam evaporation.

In a final step S111, lithographic patterning and etching of ITO and Cu may result in the formation of the electron and hole contacts. The resulting solar cell may be annealed at e.g. 150° C. before for example measurements are performed.

In the conventional process (such as the process 100 described above with reference to FIG. 1), the wet cleaning step after the dry-etching of the first passivation layer stack may be cumbersome and may require to remove the substrate from the PECVD tool. Moreover, such a step may require the use of chemicals (such as HF) which may be both dangerous and require specific disposal and treatment of the associated chemical waste.

Embodiments of a method (or process) according to the present disclosure aimed at circumventing the above disadvantages will now be described more fully hereinafter with reference to the accompanying drawings. The drawings show some embodiments, but the invention may, however, be embodied in many different forms and should not be construed as limited to the embodiments set forth herein; rather, these embodiments are provided for thoroughness and completeness, and fully convey the scope of the present disclosure to the skilled person.

With reference to FIG. 2, an embodiment of a method for creating an interdigitated pattern for a (interdigitated) back-contacted solar cell according to the present disclosure is described in the following.

FIG. 2 illustrates schematically a flowchart of a method 200 for creating an interdigitated pattern for a solar cell (such as the interdigitated pattern formed by steps S102 to S108 in the conventional process/method 100 described earlier herein with reference to FIG. 1).

In a first step S201, a first passivation layer stack is deposited on a surface of a silicon substrate. The method of depositing, and the constituents of, the first passivation layer stack may e.g. be as described with reference to step S102 of the method 100. For example, the first passivation layer stack may include at least a layer of (hydrogenated) amorphous silicon, a-Si, of a first doping type (e.g. a p-type or n-type layer; a-Si:H ($p^+$or $n^+$)). The first passivation layer may also include an intrinsic layer, a-Si:H(i), which may e.g. be deposited before the doped layer.

In a second step S202, the deposited first passivation layer stack is patterned using a first dry etching process, to create one or more regions including the a-Si of the first doping type, and one or more exposed regions of the surface of the substrate. The patterning of the first passivation layer stack may for example be performed as described with reference to steps S103-S105 of the method 100. For example, in some embodiments, the first dry etching process may be an $NF_3$/Ar plasma etching process.

In a step S203, the one or more exposed regions of the surface are then cleaned from surface contaminants remaining from the first dry etching process. The step S203 will be described in more detail further below.

In a step S204, after cleaning of the one or more exposed regions of the surface, the method 200 may include depositing a second passivation layer stack. The method of depositing, and the constituents of, the second passivation layer stack may e.g. be as described with reference to step S107 of the method 100. The second passivation layer stack may include at least a layer of (hydrogenated) a-Si of a second doping type different from the first doping type (e.g. a-Si:H ($n^+$ or $p^+$)) on the one or more exposed regions, thereby creating one or more regions including the a-Si of the second doping type on the one or more exposed regions of the surface. The patterned first passivation layer stack and the one or more regions including the a-Si of the second doping type may form the interdigitated pattern. Parts of the a-Si of the second doping type deposited on the hard mask in regions with a-Si of the first doping type (i.e. the first passivation layer stack) may e.g. be removed during lift-off as described with reference to step S108 of the conventional method 100.

In contrast to the cleaning step S106 of the conventional method 100 described with reference to FIG. 1, the cleaning step S203 of the method 200 according to the present disclosure does not require the use of wet chemicals (such as in an HF cleaning process). The cleaning step S203 of the method 200 according to the present disclosure will be described below with reference to FIGS. 3a-3e.

Figure 3A:
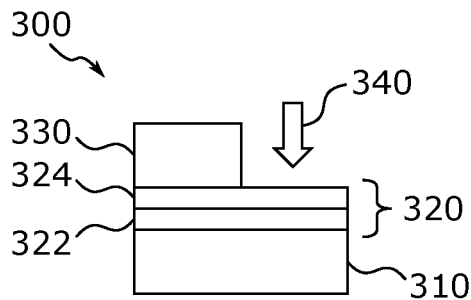
FIGS. 3($a$)-3($e$) schematically illustrate the cleaning step of an embodiment of a method for creating an interdigitated pattern of a back-contacted solar cell according to the present disclosure.

FIG. 3a illustrates schematically an intermediate structure 300 of a solar cell as obtained after S201 of method 200, including a silicon substrate 310 upon which a first passivation layer stack 320 has been deposited. The first passivation layer stack 320 includes layers of hydrogenated intrinsic amorphous silicon, a-Si:H(i), 322 and hydrogenated p-type amorphous silicon, a-Si:H($p^+$), 324. A patterned hard mask 330 has also been applied on top of the first passivation layer stack 320, and a first dry etching process 340 (e.g. an NF$_3$/Ar plasma etching process) is used to remove the regions of the first passivation layer stack 320 which are not protected by the patterned hard mask 330. The first dry etching process 340 may be performed in for example a PECVD tool.

Figure 3B:
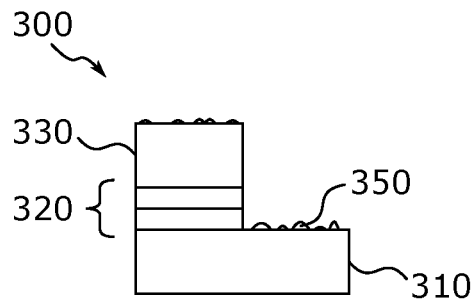

FIG. 3b illustrates schematically the state of the intermediate structure 300 of the solar cell after the first dry etching process has been completed. Surface contaminants 350, e.g. F and/or N species from the first dry etching process remains on exposed regions of the surface of the substrate 310. The state of the intermediate structure 300 of the solar cell as illustrated in FIG. 3b may correspond to the state of the solar cell after the step S202. The surface contaminants 350 are illustrated as non-uniformly distributed trace contamination. It is envisaged also that the surface contaminants 350 may e.g. be more uniformly distributed, and e.g. cover a larger part of the exposed surface of the substrate 310. It is envisaged also that surface contaminants may be present also on the hard mask.

Figure 3C:
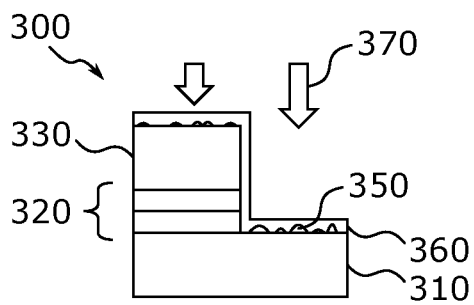

FIG. 3c illustrates schematically the intermediate structure 300 of the solar cell and the cleaning step S203. A sacrificial layer 360 is deposited on the exposed regions of the surface of the substrate 310 (and on the hard mask 330), such that the sacrificial layer 360 incorporates the surface contaminants 350. Using a second dry etching process 370 (e.g. a hydrogen based plasma etching process, without contaminating species), the sacrificial layer 360 is then removed, and the surface contaminants 350 are removed along with the sacrificial layer 360. In one embodiment, the sacrificial layer 360 may for example be a layer of a-Si. It is envisaged also that, in other embodiments of the method 200 of the present disclosure, the sacrificial layer may instead, or in addition, include a-Ge, a-SiGe, a-SiO$_x$, a-SiC or similar. The sacrificial layer 360 may be thin, e.g. have a thickness of below 2 nm. In some embodiments, the thickness of the sacrificial layer 360 may be below 1.5 nm. In some embodiments, the thickness of the sacrificial layer 360 may be below 1 nm. A thin sacrificial layer 360 may be removed without excessive damage to the underlying crystalline silicon substrate 310. A thin sacrificial layer 360 may reduce the required etch time, which may reduce the number of defects that are (or may be) induced in the underlying silicon substrate 310 during etching. This may be important e.g. in parallel plate PECVD tools without remote plasma. A required etch time for the second dry etching process may be for example below 2 minutes, or below 1 minute. In some embodiments, the temperature of depositing and removal (dry etching) of the sacrificial layer 360 may be such that it does not exceed 250° C. For example, in some embodiments, the temperature may not exceed 200° C., or 175° C. Also, in some embodiments, the temperature may be such that it is above 150° C., in order to be sufficiently high to allow for depositing and removal of the sacrificial layer 360. Keeping the temperature at or below 250° C. may avoid damaging the solar cell, especially if the solar cell is of the silicon heterojunction type based on hydrogenated a-Si.

The first dry etching process 340 and the cleaning/removal of contaminants using the sacrificial layer 360 (i.e. the depositing of the sacrificial layer 360 and the second dry etching process 370) may in some embodiments be performed within the same PECVD tool.

Figure 3D:
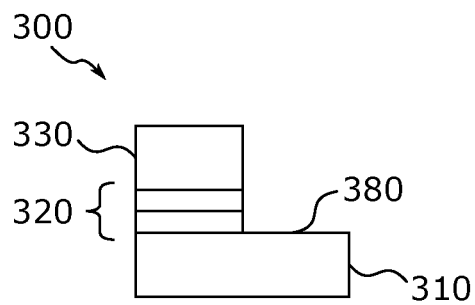

FIG. 3d illustrates schematically the intermediate structure 300 of the solar cell after the cleaning step S203, including a cleaned exposed surface 380 of the substrate 310.

Figure 3E:
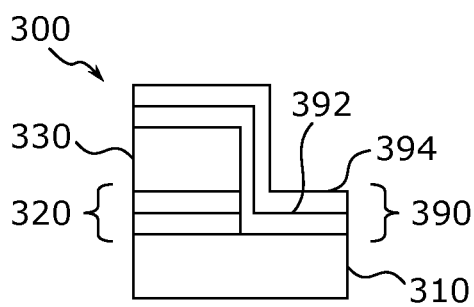

FIG. 3e illustrates schematically the intermediate structure 300 of the solar cell after step S204, wherein the cleaned surface has been repassivated by depositing a second passivation layer stack 390. The second passivation layer stack 390 includes layers of hydrogenated intrinsic amorphous silicon, a-Si:H(i), 392 and hydrogenated n-type amorphous silicon, a-Si:H(n$^+$), 394. The a-Si:H(i) 392 may for example be deposited before the a-Si:H(n$^+$) 394. The second passivation layer stack 390 covers also regions of the hard mask 330, and the on these regions deposited parts of the second passivation layer stack 390 may be removed along with the hard mask 330 during a subsequent lift-off/dissolution step, such as the step S108 of the conventional method 100 described with reference to FIG. 1. The state of the intermediate structure 300 of the solar cell in FIG. 3e may correspond to the state of the intermediate structure after step S204 of the method 200 according to the present disclosure.

In some embodiments, the deposition and subsequent etching of the sacrificial layer may for example be accomplished in a single plasma process, as will now be described.

Figure 4:
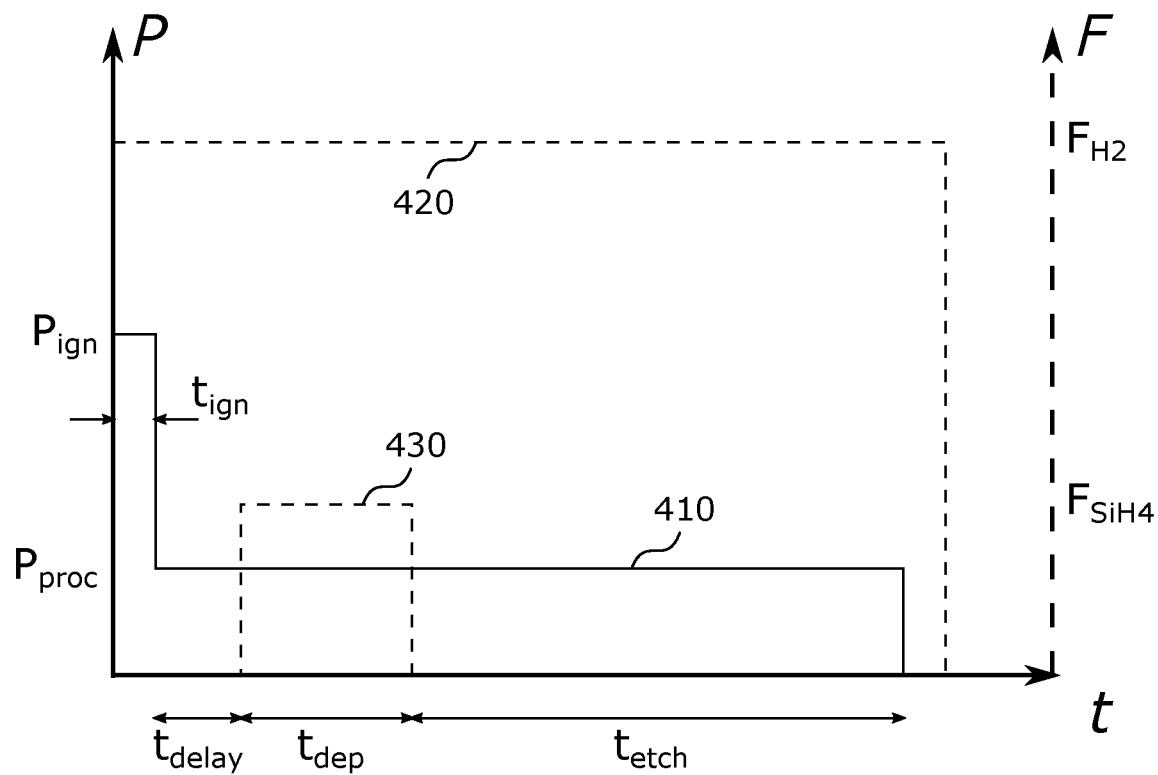
FIG. 4 schematically illustrates an embodiment of a single plasma cleaning process according to the present disclosure.

An embodiment of such a single plasma (cleaning) process according to the present disclosure will now be described with reference to FIG. 4, which illustrates schematically a diagram of power density (P; solid line 410) and flow (F; dashed lines 420 and 430) as functions of time (t). It is envisaged that the values given for various parameters may be changed by the skilled person while still staying within the scope of the present disclosure. It is also noted that the diagram in FIG. 4 may not necessarily be drawn to scale.

At the beginning of the process, after stabilization of gas flows, e.g. a flow ($F_{H2}$) 420 of H$_2$ at e.g. approximately 640 sccm, and pressure (e.g. a pressure of approximately 2-3.5 mbar), a plasma may be ignited at a higher power density ($P_{ign}$) compared to the power density ($P_{proc}$) used for processing. Once the plasma is ignited (after a time $t_{ign}$), it may be sustained at a lower power (e.g. $P_{proc}$), which may allow for better control over the process(es) and also reduce plasma-related damage to the substrate. A typical range of power densities used for ignition and processing may be e.g. $P_{ign}$=125-300 mW/cm$^2$, and $P_{proc}$=22-50 mW/cm$^2$. To prevent plasma damage, the ignition step of the process may be kept short (e.g. $t_{ign}$<5 s). The plasma may be ignited with only hydrogen flow 420 in the process chamber. This may prevent depositions from occurring during the high-power phase of plasma ignition. If silane is introduced, with a flow ($F_{siH4}$) 430 of SiH$_4$ at e.g. approximately 160 sccm, into the chamber with an ignited plasma, deposition of a-Si may occur. By delaying the silane flow 430 into the chamber (e.g. by a delay time $t_{delay}$ of approximately 5-10 s), the thickness of the deposited a-Si sacrificial layer may be well-controlled if deposition only occurs during the low-power phase. The thickness of the deposited a-Si sacrificial layer may be controlled by the silane flow time which may be approximately equal to the a-Si deposition time (e.g. a deposition time $ta_p$ of approximately 2-10 s). As described earlier, the deposited a-Si layer thickness may be kept below 1 nm. If the flow 430 of silane is turned off, H-plasma etching of the deposited a-Si sacrificial layer may begin. With an etch rate of e.g. 1 nm/min at a power density of e.g. 22 mW/cm$^2$, the sacrificial layer may be completely etched of within 60 s, e.g. with an etching time $t_{etch}$ of approximately 40-60 s. The entire process of depositing and removing of the sacrificial layer may be performed in less than e.g. 2 minutes. The combination of pressure and H$_2$/SiH$_4$ gas flow ratios may be chosen such that reliable plasma ignition and a stable plasma for processing may be achieved. The cleaning according to the present disclosure may be performed at a low temperature of 150-250° C., which is compatible with e.g. SHJ-IBC solar cells which should be processed below 250° C. to avoid degradation of e.g. a-Si:H contact layers.

In the method of the present disclosure, the use of the sacrificial layer and subsequent second dry etching process may allow for the exposed regions (after etching of the first passivation layer stack) of the surface to be cleaned without using wet chemicals, and in situ such that it is not required to remove the substrate from the (PECVD) tool in order to perform the cleaning. The cleaning may be performed in situ directly after dry etching, before in situ repassivation may be performed within the same tool. This may simplify the rear-side processing sequence, increase substrate throughput and reduce cost. Further advantages may include the use of a PECVD system without remote plasma.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for creating an interdigitated pattern for a back-contacted solar cell, comprising:
    depositing a first passivation layer stack including at least a layer of amorphous silicon, a-Si, of a first doping type on a surface of a silicon substrate of the back-contacted solar cell;
    patterning the first passivation layer stack by using a first dry etching process, thereby creating one or more regions including the a-Si of the first doping type, and one or more exposed regions of the surface;
    cleaning the one or more exposed regions of the surface from contaminants remaining from the first dry etching process; and
    depositing, after the cleaning of the one or more exposed regions, a second passivation layer stack including at least a layer of a-Si of a second doping type different from the first doping type on the one or more exposed regions, thereby creating one or more regions including the a-Si of the second doping type on the one or more exposed regions of the surface,
    wherein the patterned first passivation layer stack and the one or more regions including the a-Si of the second doping type form the interdigitated pattern, and
    wherein the cleaning of the one or more exposed regions comprises:
        depositing a sacrificial layer at least on the one or more exposed regions of the surface; and
        removing the sacrificial layer by a second dry etching process, wherein the depositing and removing of the sacrificial layer are performed at a temperature not exceeding 250° C.

2. The method of claim 1, wherein the deposition of the first passivation layer stack and the cleaning of the one or more exposed regions are performed within a same PECVD tool.

3. The method of claim 2, wherein the deposition of the second passivation layer stack is performed within the same PECVD tool.

4. The method of claim 1, wherein the sacrificial layer is a layer of a-Si.

5. The method of claim 1, wherein an average thickness of the sacrificial layer is below 2 nm.

6. The method of claim 1, wherein the first dry etching process is an $NF_3$/Ar plasma etching process.

7. The method of claim 1, wherein the second dry etching process is a hydrogen plasma etching process.

8. The method of claim 1, wherein the sacrificial layer is deposited using a plasma-enhanced chemical vapor deposition, PECVD, process.

9. The method of claim 1, wherein the patterning of the first passivation layer stack and the cleaning of the one or more exposed regions are performed within a same PECVD tool.

10. The method of claim 1, wherein the first doping type is p-type and the second doping type is n-type.

11. The method of claim 1, wherein the first doping type is n-type and the second doping type is p type.

12. The method of claim 1, further comprising forming electrodes contacting the one or more regions including the a-Si of the first doping type and the one or more regions including the a-Si of the second doping type.

13. The method of claim 1, wherein the depositing and removing of the sacrificial layer are performed at a temperature not exceeding 200° C.

14. The method of claim 1, wherein the depositing and removing of the sacrificial layer are performed at a temperature of or above 150° C.

15. The method of claim 1, wherein the depositing and removing of the sacrificial layer form part of a single plasma process.

* * * * *